US006627543B1

(12) United States Patent
Cao et al.

(10) Patent No.: US 6,627,543 B1
(45) Date of Patent: Sep. 30, 2003

(54) LOW-TEMPERATURE SPUTTERING SYSTEM AND METHOD FOR SALICIDE PROCESS

(75) Inventors: Wanqing Cao, Portland, OR (US); Guo-Qiang Patrick Lo, Portland, OR (US); Shih-Ked Lee, Hillsboro, OR (US); Robert B. Hixson, Portland, OR (US); Eric S. Lee, Vancouver, WA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/564,304

(22) Filed: May 3, 2000

(51) Int. Cl.[7] .............................................. H01L 21/44
(52) U.S. Cl. ....................................... 438/664; 438/683
(58) Field of Search ................................ 438/664, 682, 438/683, FOR 196, FOR 360, FOR 361

(56) References Cited

U.S. PATENT DOCUMENTS

| 5,728,625 | A |   | 3/1998 | Tung |  |
|---|---|---|---|---|---|
| 5,780,361 | A |   | 7/1998 | Inoue |  |
| 5,902,129 | A | * | 5/1999 | Yoshikawa et al. |  |
| 6,022,795 | A | * | 2/2000 | Chen et al. |  |
| 6,117,771 | A | * | 9/2000 | Murphy et al. | 438/679 |
| 6,292,346 | B1 | * | 9/2001 | Ohno et al. | 361/234 |
| 6,458,703 | B2 | * | 10/2002 | Endo et al. | 438/688 |

FOREIGN PATENT DOCUMENTS

JP          05186868 A   *  7/1993   ............ C23C/14/34

OTHER PUBLICATIONS

Inoue et al., "A new Cobalt Salicide Technology for 0.5$\mu$m CMOS Devices", IEEE Transactions on Electron Devices, vol. 45, No. 11, Nov. 1998, p. 2312–2318.*

* cited by examiner

Primary Examiner—George Fourson
Assistant Examiner—Suk-San Foong
(74) Attorney, Agent, or Firm—Marger, Johnson & McCollom PC

(57) ABSTRACT

Disclosed are methods and systems for forming salicide, in which a semiconductor substrate is provided with at least one exposed silicon surface. The semiconductor substrate is placed into a sputtering chamber. A silicide-forming metal layer, formed of a metal such as Co, Ni, is sputter-deposited over the exposed silicon surface. A process temperature is controlled below room temperature during the sputter deposition and preferably between approximately 0° C. to 10° C. The silicide-forming metal layer formed on the exposed silicon surface is first annealed to convert the silicide-forming metal layer into a salicide layer. Also, the system of the present invention is comprised of a sputter chamber including a mount for mounting a semiconductor substrate and a cooling mechanism coupled with the mount for cooling the semiconductor substrate. The cooling mechanism includes a controller to maintain a process temperature below room temperature. Improved device characteristics such as increased charge-to-breakdown can be achieved in the devices according to the present invention compared to the devices with high-temperature sputtered salicide.

7 Claims, 4 Drawing Sheets

Effects of Cobalt Dep Temperature on Qbd

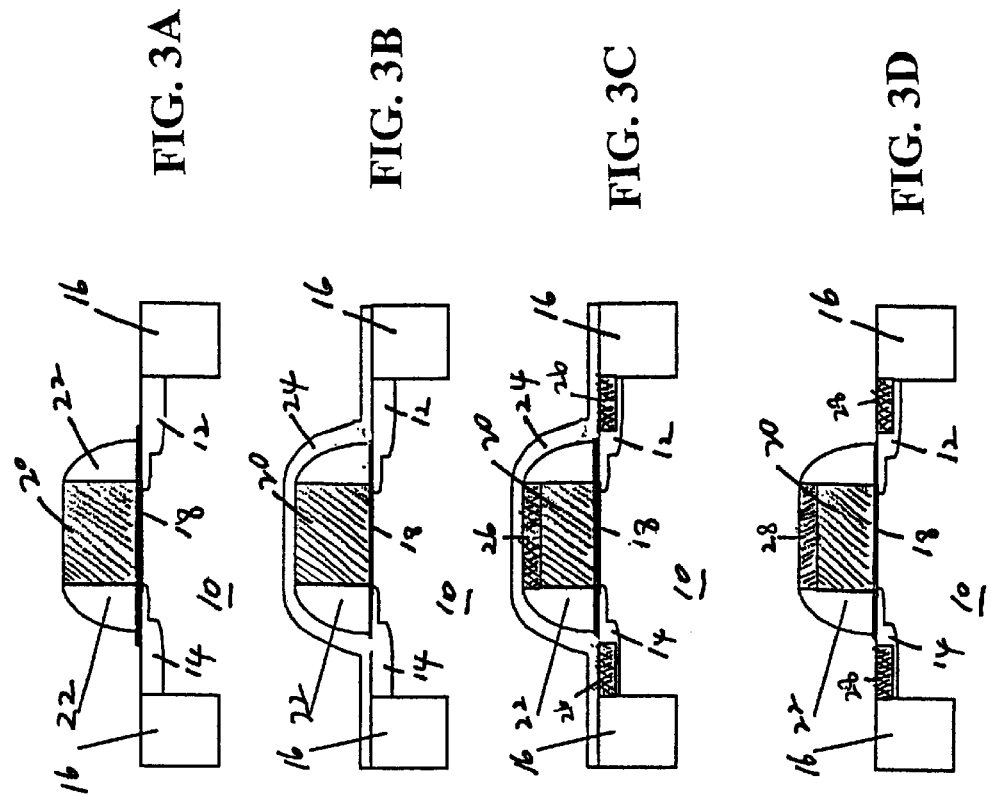
FIG. 3A
FIG. 3B
FIG. 3C
FIG. 3D
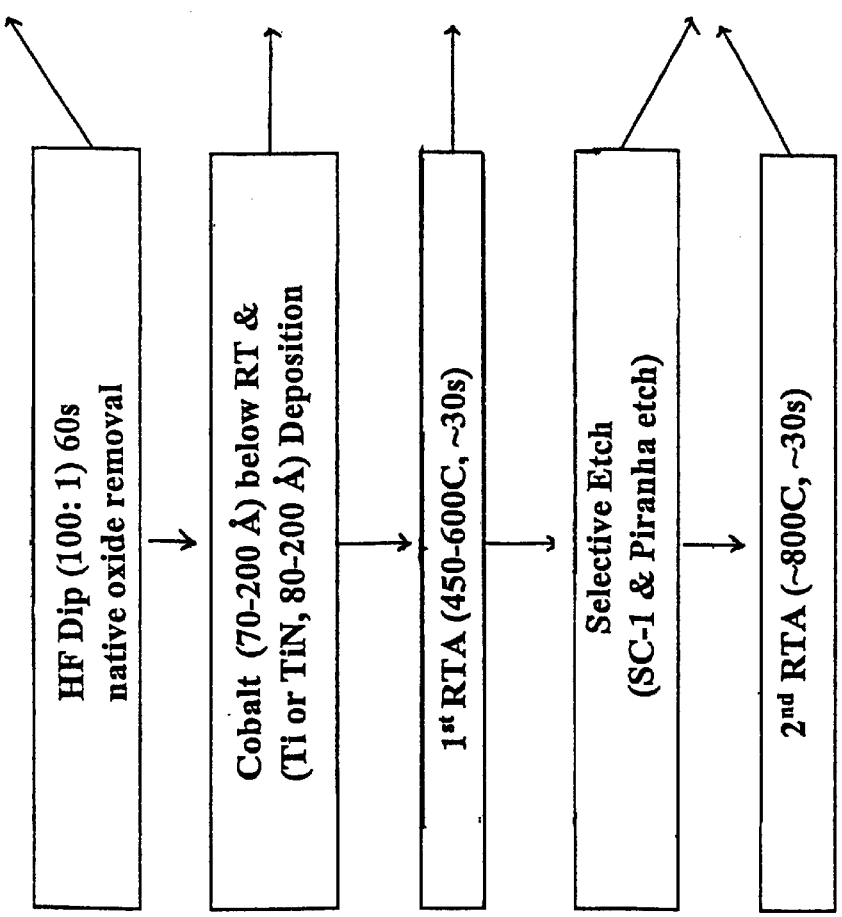
FIG. 2

LOW-TEMPERATURE SPUTTERING SYSTEM AND METHOD FOR SALICIDE PROCESS

BACKGROUND OF THE INVENTION

1. Field of the Invention

This invention relates to a method of manufacturing semiconductor devices and, more particularly, to a self-aligned silicide ("salicide") process.

2. Description of the Related Art

As semiconductor devices become highly integrated with smaller line widths and geometries, various problems such as increased contact resistance, leakage currents, and junction punchthrough occur, causing a degradation in the device performance and reliability of the semiconductor manufacturing processes. For example, the polysilicon electrodes that form the gates of MOS devices and shallow diffusions become undesirably resistive, limiting the speed of circuits. A variety of device technologies have been investigated in an effort to alleviate these problems.

One such technology is a so-called salicide process using self-aligned silicides, i.e., low-resistivity compounds formed by the reaction of noble or refractory metals with the underlying silicon, in the formation of contacts. By forming such low resistivity silicides on their surfaces, the sheet resistance of polysilicon gate and diffusion can be reduced.

According to conventional salicide processes, a layer of a refractory metal is blanket deposited by sputtering over the integrated circuit structure. Following the blanket deposit, the resulting structure is annealed so that the metal will react with the underlying silicon to form a self-aligned silicide.

Titanium (Ti) salicide, formed by the reaction of deposited titanium and the underlying silicon, has been widely used for the salicide process because it has many excellent properties such as low junction leakage, low sheet resistance, and low contact resistance. However, Ti salicide also has problems such as a linewidth-dependent increase in sheet resistance and a decrease of thermal process window for forming Ti salicide. These problems have become more severe as device features shrink below 0.20 $\mu$m. As a result, Ti salicide has become a more and more unsuitable material in the modern semiconductor manufacturing process.

Recently, cobalt (Co) salicide has become an important alternative over Ti salicide because they remain independent of line widths. However, Co salicide has its own problems. Conventionally, Co sputter deposition is performed at room temperature or higher. For example, U.S. Pat. Nos. 5,728,625 and 5,780,361 disclose Co sputter deposition performed above room temperature. Unfortunately, semiconductor devices with Co salicide, formed using the conventional sputtering process, have shown unsatisfactory device characteristics such as low charge-breakdown (Qbd).

Accordingly, there is still a need for improvement in the salicide process to improve device characteristics such as Qbd.

SUMMARY OF THE INVENTION

It is, therefore, an object of the invention to improve the device characteristics and reliability of a semiconductor device formed using a salicide process.

The present invention provides a method for forming a salicide layer on a selected portion of a semiconductor substrate. The method of the present invention comprises providing a semiconductor substrate with at least one exposed silicon surface. The semiconductor substrate is placed into a sputtering chamber. A silicide-forming metal layer is sputter deposited over the exposed silicon surface. A process temperature is controlled below room temperature during the sputter deposition. The silicide-forming metal layer formed on the exposed silicon surface is first annealed to convert the silicide-forming metal layer into a salicide layer.

In addition, a novel sputter deposition system is provided for depositing a silicide-forming metal layer on a semiconductor substrate in accordance with the present invention. The system of the present invention is comprised of a sputter chamber including a mount for mounting a semiconductor substrate; a cooling mechanism coupled with the mount for cooling the semiconductor substrate. The cooling mechanism includes a controller to maintain a process temperature below room temperature.

In the devices formed accordance with the present invention, increased charge-to-breakdown is achieved compared to the devices with a conventionally processed salicide structure, thereby improving the characteristics of the devices.

The foregoing and other objects, features and advantages of the invention will become more readily apparent from the following detailed description of a preferred embodiment of the invention that proceeds with reference to the accompanying drawings

BRIEF DESCRIPTION OF THE DRAWINGS

FIG. 2 is a flow diagram of a semiconductor process for forming a salicide structure.

FIG. 3A is a partial cross-sectional view of a silicon substrate with a gate and source/drain regions after the first and second steps of FIG. 2.

FIG. 3B shows the structure of FIG. 3A after the third step of FIG. 2, in which a Co layer is deposited over the resulting structure.

FIG. 3C shows the structure of FIG. 3B after the fourth step of FIG. 2, in which Co salicide layers are formed on the gate structure and the source/drain regions by the reaction between the Co layer and the underlying silicon.

FIG. 3D shows the structure of FIG. 3C after the fifth and sixth steps of FIG. 2, in which unreacted portions of the deposited Co layer are etched away.

DETAILED DESCRIPTION

Figure 1:
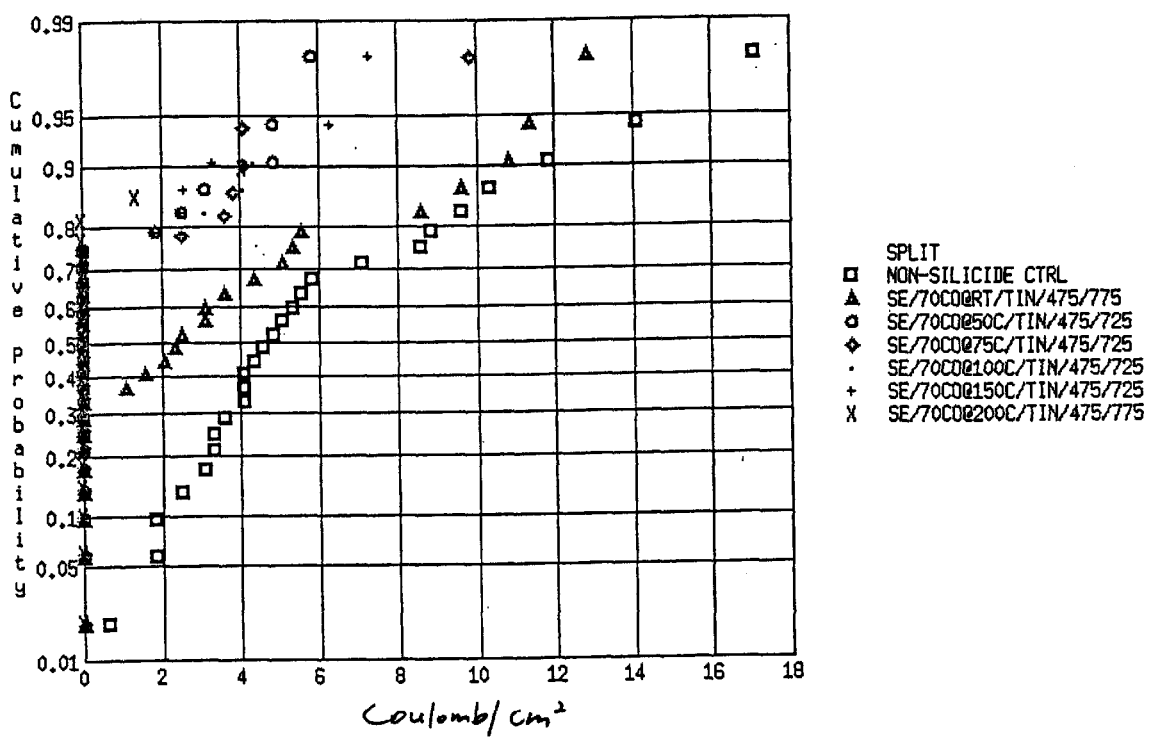
FIG. 1 is a graph showing the degradation of Qbd data measured on a device manufactured by conventional Co sputter deposition at above room temperature compared to Qbd data measured on a device formed without a salicide layer (non-silicide).

Referring to FIG. 1, we have observed that a conventional Co salicide structure formed at room temperature or higher suffers the problem of device-characteristic degradation such as lower Qbd (charge-to breakdown). For example, when the non-silicide device structure (no Co salicide formed on the gate, source and drain regions) is compared with the device structure with the Co salicide, the latter shows lower Qbd.

For the purpose of generating experimental data, MOS capacitors were fabricated for electrical characterization. Oxide thickness was thirty-four (34) Angstroms for all processes. The substrates were n-type Si wafers with n-well implant. P$^+$ polysilicon was used as a gate material. Qbd was measured by constant current of five (5) nanoamps/square micrometer (nA/$\mu$m$^2$). A constant current passes through the gate and the substrate and the time to dielectric breakdown is measured. The dielectric breakdown occurs when the absolute voltage drop between the gate and the substrate is less than a pre-defined value such as 10%–20% voltage drop across the gate, thereby measuring the integrity of gate dielectrics. The pad size for silicide is 100×100 $\mu$m$^2$. The higher the Qbd value, the better quality the gate dielectrics under the test condition. If there is any point defect in the silicide, the pad size will also affect the result of Qbd beside the gate oxide integrity. Even though different IC manufacturers may use different test structures, measurement principle and basic test setup should be all similar.

It is believed that such degradation shown in FIG. 1 may be due to Co diffusion through the polysilicon gate toward the gate dielectrics during sputter deposition, resulting in more damage to the gate dielectrics.

Thus, the present invention contemplates an improved method for forming a Co salicide layer on a selected portion of a semiconductor substrate to solve such problems.

FIG. 2 is a flow diagram of a semiconductor process for forming a Co salicide structure according to the present invention.

FIGS. 3A through 3D are cross-sectional views of a MOS transistor during various stages of fabrication according to the process flow illustrated in FIG. 2.

As shown in FIG. 3A, a semiconductor substrate 10 is provided with source and drain regions 12 and 14 respectively in an active region defined between field regions 16. In addition, a gate dielectric layer 18, formed of a material such as silicon dioxide, is formed over the active region. A polysilicon gate 20 is formed over the gate dielectric layer 18. Also, a sidewall spacer 22 is formed to prevent silicide formation on the side of the polysilicon gate 20. The sidewall spacer 22 is formed by first depositing an insulating layer formed of a material such as silicon oxide, silicon nitride, or a combination thereof, followed by etching. Accordingly, portions of the insulating layer are left on the side of the gate while the remaining portions of the insulating layer are removed from the source and drain regions and the top of the gate as shown. The resulting structure for forming Co salicide is well known in the art.

In the resulting structure, native oxides (not shown) formed on the exposed silicon surface, i.e., the source and drain regions and the top of the gate, are removed by techniques such as HF dip because the Co layer cannot reduce native oxides on Si as can Ti layer.

Referring to FIG. 3B, a Co layer 24 is sputter-deposited to a thickness of 70 to 200 Angstroms over the exposed silicon surface by applying a DC power of 600 W in an argon flow of 15 sccm. It is believed to be important to the success of the present invention that a process temperature is controlled at a range that minimizes Co diffusion through the polysilicon gate 20 during the sputter deposition, thereby solving the problems of the conventional Co salicide process. Specifically, the process temperature is controlled approximately below room temperature. The process temperature is preferably controlled substantially below room temperature. For example, the process temperature is controlled in a range of approximately 0° C. to approximately 10° C. More preferably, the process temperature is controlled approximately at 4° C. The temperature is preferably measured on the wafer or the semiconductor substrate by use of a DTC (direct thermal couple).

Optionally, a capping layer (not shown for the sake of clarity), formed of a material such as TiN, is formed to a thickness of 80–200 Angstroms over the Co layer 24 using conventional techniques to prevent contamination or unnecessary oxidation on the surface of the Co layer 24.

Turning to FIG. 3C, the Co layer 24 formed on the exposed silicon surface is first annealed to convert the Co layer 24 into Co salicide layers 26. Preferably, first annealing is performed at 450–600° C. for approximately thirty (30) seconds. Upon annealing, the Co reacts with the underlying silicon to form a desired salicide structure. After the first annealing, unreacted portions of the Co layer 24 are etched away. The unreacted portions of Co layer are preferably etched in a solution of SC-1 and H$_2$SO$_4$/H$_2$O$_2$ Piranha solution.

Further, as shown in FIG. 3D, second annealing is performed on the Co salicide layers 26 formed on the exposed silicon surface to improve (decrease) the resistivity of the final salicide. Preferably, the second annealing is performed at approximately 800° C. for approximately thirty (30) seconds. Preferably, the first and second annealing processes are performed by a rapid thermal annealing (RTA) process.

Consequently, twice annealed Co salicide layers 28 are formed simultaneously on both the source and drain regions and the top of the gate. The resulting structure is self-aligned to the gate 20 and source and drain regions 12 and 14 and is thus called the salicide.

Figure 4:
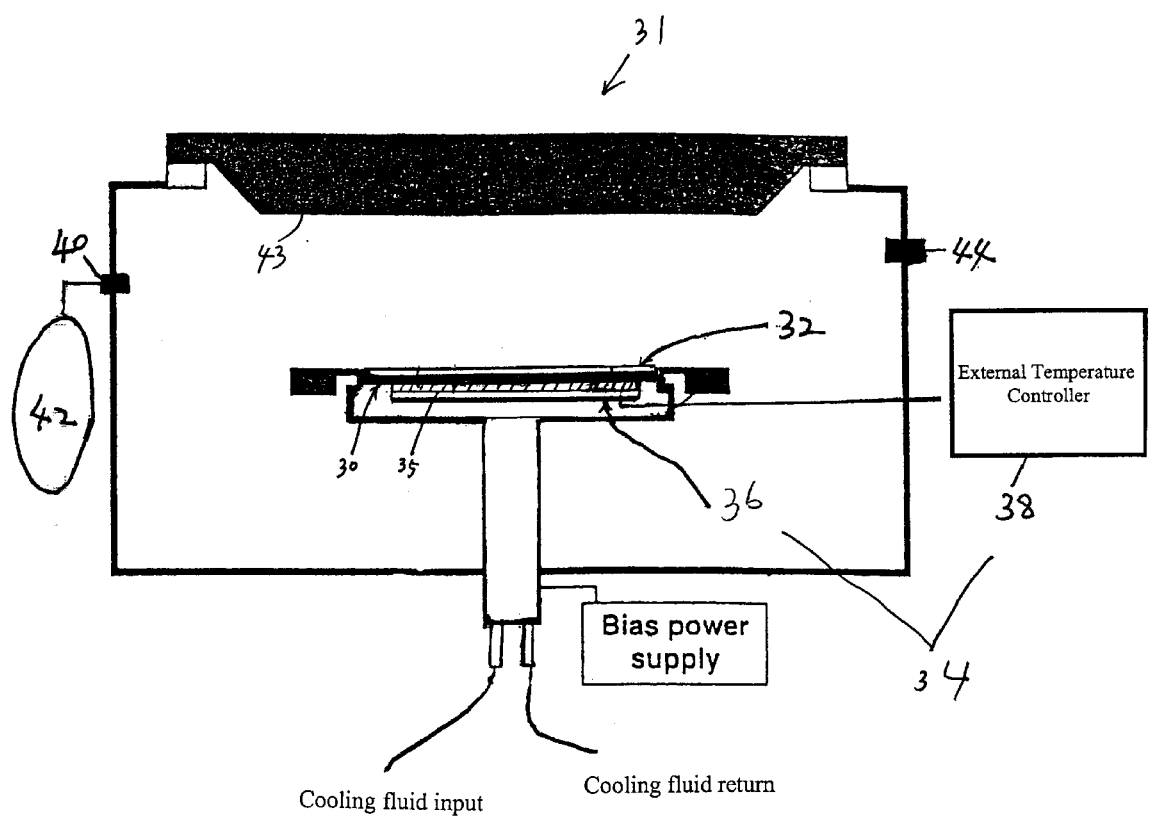
FIG. 4 is a schematic diagram of the sputtering chamber used for the present invention.

FIG. 4 illustrates a sputtering chamber that can be used for the present invention. Sputtering chamber 31 includes a mount 30 or chuck for mounting a semiconductor substrate or wafer 32. A cooling mechanism 34 includes a cooling fluid source (not shown) and a cooling fluid line 36 coupled with mount 30 for cooling the semiconductor substrate 32 through a heater 35. In addition, an external temperature controller 38 is provided to control a process temperature below room temperature.

In a conventional sputtering chamber, a cooling water line is connected to a Neslab heat exchanger, controlling a process temperature above room temperature and beyond because cooling below room temperature heretofore was not seen to be needed in the conventional Co salicide process.

In the present invention, to make it possible to control the process temperature below room temperature, the heater 35, which is part of a conventional sputter chamber, is turned off and cooling fluid line 36 is connected to an external temperature controller 38 that is capable of controlling the temperature from approximately 0° C. up to room temperature. The process chamber for the present invention is constructed utilizing the conventional sputter chamber with the additional external temperature controller 38. Thus, although the heater 35 is included in the chamber 31, it is not necessary for the present invention and can be omitted. The controller 38 is preferably capable of controlling the temperature of the substrate 32 between approximately 0° C. to approximately 10° C. The controller is more preferably capable of controlling the temperature of the substrate at approximately 4° C.

A cooling fluid used in cooling fluid line 36 as coolants can be ethylene glycol, DI water or any other suitable refrigerant. Cooling fluid line 36 is in contact with the heater 35, (which is of course turned-off) for cooling the mount 30, in turn, the substrate 32. Additionally, the sputter chamber 31 is fitted with a gas inlet 40, a gas exit 44, and a Co target 43. A gas supply 42 is coupled to sputtering chamber 31 through the gas inlet 40.

Figure 5:
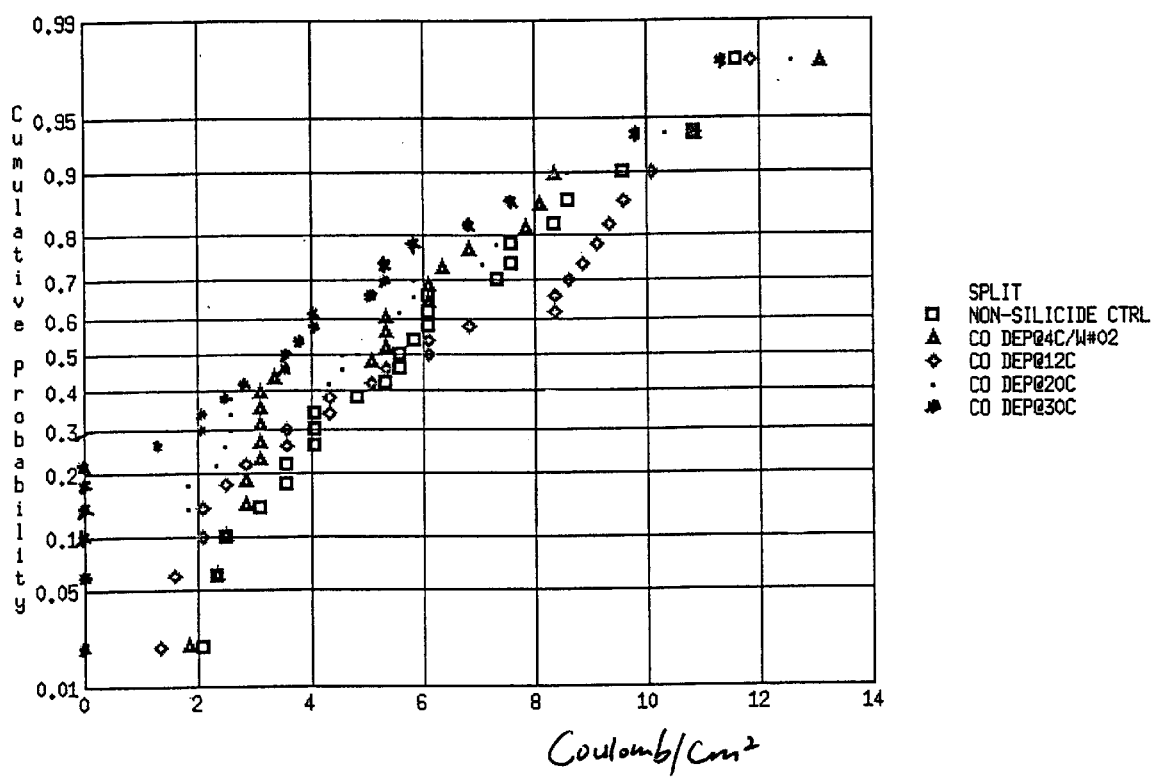
FIG. 5 is a graph to show advantages of the present invention comparing Qbd data measured for devices without Co sputter deposition and devices manufactured using Co sputter deposition conducted below room temperature in accordance with the present invention.

Now referring to FIG. 5, advantages of the present invention are illustrated. As illustrated in FIG. 5, Qbd curve of the devices formed in accordance with the present invention are shifted to the right (meaning better or higher Qbd) compared to the Qbd curve shown in FIG. 1 of the devices manufactured using conventional high-temperature (above room temperature) Co sputtering. Thus, the device characteristics of the present invention are significantly improved because they exhibit the same distribution curve as the non-silicide structure while still retaining the low sheet resistance unique to Co salicide. Also, the infant mortality rate of Qbd, i.e., percentage of devices that have zero Qbd, is significantly improved. That is, in contrast with the infant mortality rate of the devices sputtered at 200° C. being 80% (FIG. 1), the devices sputtered at 4° C. in accordance with the present invention have shown infant mortality rate being approximately 0%.

It is believed that the improvement in Qbd may indicate less Co attacking on gate dielectrics. That is, low-temperature sputtering may inhibit Co diffusion through the polysilicon gate toward the gate dielectrics. In addition, the present invention may improve the junction leakage characteristics because less Co diffusion into the polysilicon gate means less Co spikes, which can cause junction leakage.

In conclusion, in the present invention, by performing low temperature sputtering in the Co salicide process, better device characteristics such as higher Qbd are obtained, thus improving the reliability and device performance of semiconductor devices.

Although Co is preferred in the present invention and the description is directed to a Co salicide layer, other refractory or noble metals such as Ni can be used for the purpose of the present invention.

Having described and illustrated the principles of the invention in a preferred embodiment thereof, it should be apparent that the invention can be modified in arrangement and detail without departing from such principles. We claim all modifications and variation coming within the spirit and scope of the following claims.

We claim:

1. A method of forming a salicide layer on a selected portion of a semiconductor substrate, comprising:

providing a semiconductor substrate with at least one exposed silicon surface;

sputter-depositing a silicide-forming metal layer over the exposed silicon surface while cooling the semiconductor substrate to less than approximately 20° C.; and first annealing the silicide-forming metal layer to convert the silicide-forming metal layer into a salicide layer.

2. The method of claim 1, further comprising, after said first annealing;

removing an unreacted portion of the silicide-forming layer.

3. The method of claim 1, wherein the silicide-forming metal layer is formed of a metal selected from the group consisting of a refractory metal and a noble metal.

4. The method of claim 3, wherein the refractory metal is Co or Ni.

5. The method of claim 2, further comprising, after said removing:

second annealing the silicide-forming metal layer formed on the exposed silicon surface.

6. The method of claim 1, wherein the cooling the semiconductor substrate comprises cooling the substrate to a range of approximately 0° C. to approximately 10° C.

7. The method of claim 6, wherein the cooling the semiconductor substrate comprises cooling the substrate to approximately 4° C.

* * * * *